US009078372B2

(12) United States Patent
Huang et al.

(10) Patent No.: US 9,078,372 B2
(45) Date of Patent: Jul. 7, 2015

(54) POWER SYSTEM AND POWER CONVERTING DEVICE THEREOF

(71) Applicant: Chicony Power Technology Co., Ltd, New Taipei (TW)

(72) Inventors: Chih-Hsiung Huang, New Taipei (TW); Yung-Hung Hsiao, New Taipei (TW); Hao-Te Hsu, New Taipei (TW); Chi-Chang Ho, New Taipei (TW)

(73) Assignee: CHICONY POWER TECHNOLOGY CO., LTD, New Taipei (TW)

( * ) Notice: Subject to any disclaimer, the term of this patent is extended or adjusted under 35 U.S.C. 154(b) by 331 days.

(21) Appl. No.: 13/863,092

(22) Filed: Apr. 15, 2013

(65) Prior Publication Data

US 2014/0098498 A1 Apr. 10, 2014

Related U.S. Application Data

(63) Continuation-in-part of application No. 13/647,385, filed on Oct. 9, 2012.

(51) Int. Cl.

| | |
|---|---|
| ***H05K 7/00*** | (2006.01) |
| ***H05K 1/18*** | (2006.01) |
| ***H05K 7/14*** | (2006.01) |

(52) U.S. Cl.

CPC ................ *H05K 1/18* (2013.01); *H05K 7/1432* (2013.01)

(58) Field of Classification Search

CPC ............................... H05K 1/18; H05K 7/1432
USPC .......................................... 361/753, 783, 781
See application file for complete search history.

(56) References Cited

U.S. PATENT DOCUMENTS

| | | | | |
|---|---|---|---|---|
| 5,872,711 | A * | 2/1999 | Janko | 363/144 |
| 6,046,921 | A * | 4/2000 | Tracewell et al. | 363/141 |
| 7,061,775 | B2 * | 6/2006 | Beihoff et al. | 361/818 |
| 2001/0012212 | A1 * | 8/2001 | Ikeda | 363/141 |
| 2003/0133282 | A1 * | 7/2003 | Beihoff et al. | 361/818 |
| 2010/0080028 | A1 * | 4/2010 | Cheng et al. | 363/126 |

* cited by examiner

*Primary Examiner* — Yuriy Semenenko

(74) *Attorney, Agent, or Firm* — Muncy, Geissler, Olds & Lowe, P.C.

(57) ABSTRACT

A power converting device includes a first substrate, a driving module, and a converting module. The first substrate is inserted into a main plate. The first substrate has a first axial direction and a second axial direction perpendicular to the first axial direction, the second axial direction is perpendicular to the main plate. The driving module is located at one side of the first substrate and electrically connected to the first substrate. The converting module is located at the other side of the first substrate and electrically connected to the driving module. A length of the converting module is substantially equal to a length of the first substrate in the first axial direction, and a width of the converting module is smaller than the length of the first substrate in the first axial direction.

21 Claims, 10 Drawing Sheets

2a

22

22

20

POWER SYSTEM AND POWER CONVERTING DEVICE THEREOF

CROSS REFERENCES RELATED TO THE APPLICATION

This application is a continuation-in-part of co-pending application Ser. No. 13/647,385, filed on Oct. 9, 2012, for which priority is claimed under 35 U.S.C. §120, the entire contents of which are hereby incorporated by reference.

BACKGROUND OF THE INVENTION

1. Field of the Invention

The present invention relates to a power converting device and a power system, and in particular to an assembly power converting device and a power system having the assembly power converting device mentioned above.

2. Description of Related Art

Power supply devices are the essential components of industrial equipment, and are used for converting alternating current (AC) electric power into direct current (DC) electric power or providing functions of bucking or boosting. Reference is made to FIG. 1, which is a perspective view of a conventional power converting device. The power converting device 1 includes a circuit board 10 with plate form, at least one converter 12, and a plurality of electronic components. The electronic components include capacitors 140, inductors 142, resistors (not shown) or other active or passive electronic components (not shown). The converter 12 and the electronic components are respectively and independently disposed on the circuit board 10 and electrically to traces provided on the circuit board 10.

While the demanded functions of industrial equipment increased, the internal devices which are disposed within the industrial equipment are increased accordingly. In order to sufficiently driving the internal devices, the output power of the power supply device must be increased simultaneously. When the outputting power of the power supply device is increased, the tolerance (such as rated working voltage) of the converter and the electronic components may also be increased. The volume of part of electronic component, such as capacitor, is direct proportion to the rated working voltage, namely, the larger rated working voltage and the greater volume. While the electronic components with greater volume are placed on the circuit board, will occupy a lot of space in the circuit board, this becomes the main reason of the high power supply system cannot miniaturization.

SUMMARY OF THE INVENTION

It is an object to provide a compact power converting device.

It is another object to provide a power system having the power converting device mentioned above.

According, the power converting device according to one aspect of the present invention is provided. The power converting device is mounted on a main plate, the power converting device comprising a first substrate, a driving module, and a converting module. The first substrate has a first axial direction and a second axial direction perpendicular to the first axial direction. The first substrate is inserted into the main plate, such that the second axial direction is perpendicular to the main plate. The driving module is placed at one side of the first substrate and electrically connected to the first substrate. The converting module is located at the other side of the first substrate and electrically connected to the driving module, the converting module comprises a converting component, two rectifying units, and two filtering units. The rectifying units and the filtering units are symmetrically arranged relative to the converting component. A length of the converting module is substantially equal to a length of the first substrate in the first axial direction, and a width of the converting module is smaller than the length of the first substrate in the first axial direction.

According, the power system according to another aspect of the present invention is provided. The power system includes a main plate and a plurality of the power converting devices mention above. The power converting devices are mounted on the main plate and electrically connected in parallel.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
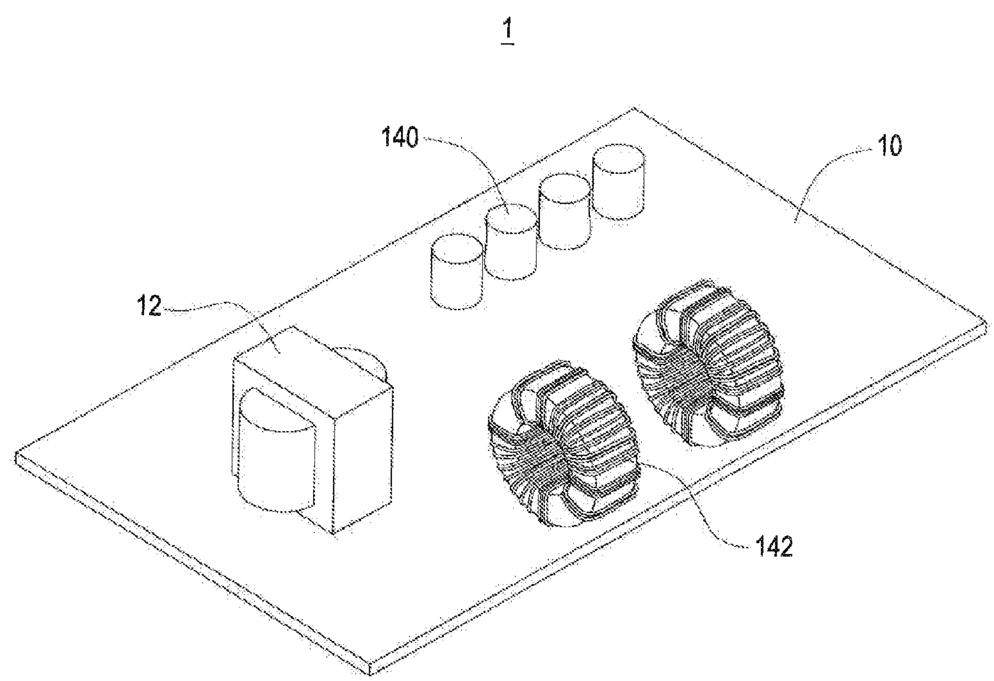
FIG. 1 is a perspective view of a conventional power converting device.
Figure 2:
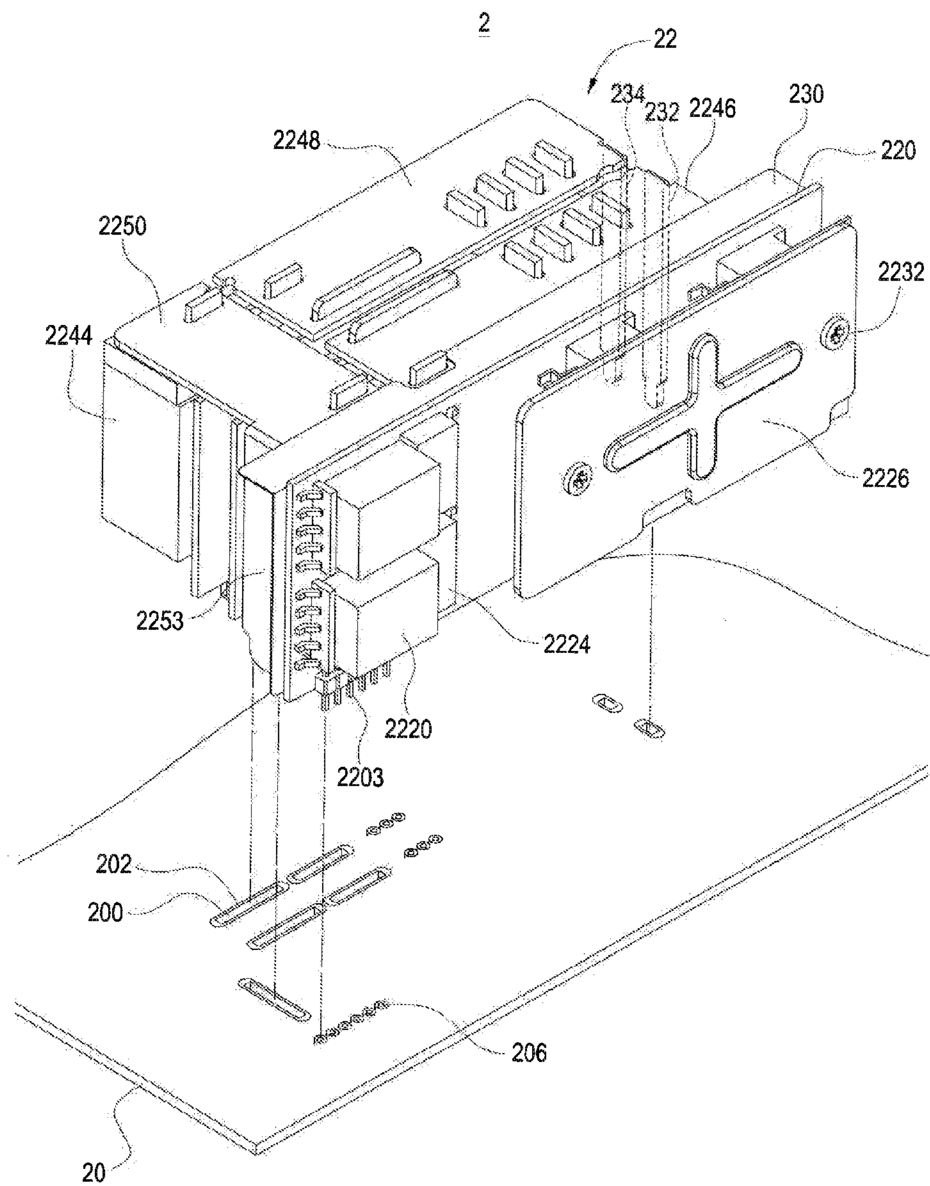
FIG. 2 is a partially exploded view of a power system according to a first embodiment of the present invention.
Figure 3:
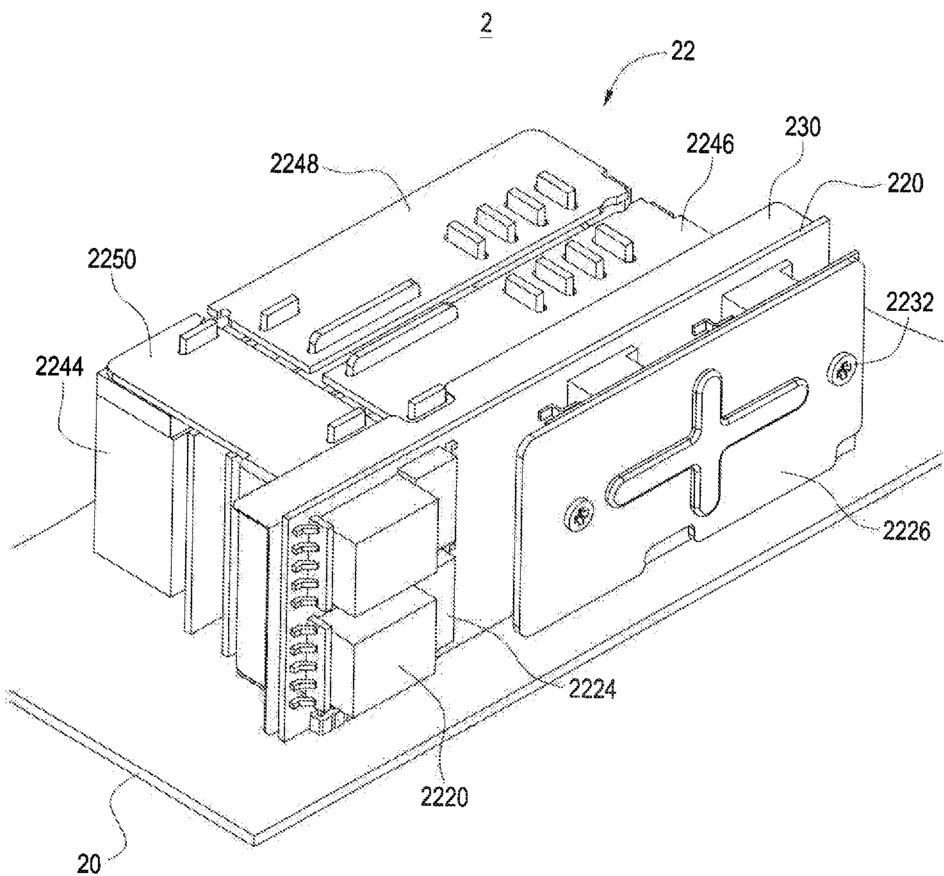
FIG. 3 is an assembly view of the power system according to the first embodiment of the present invention.
Figure 4:
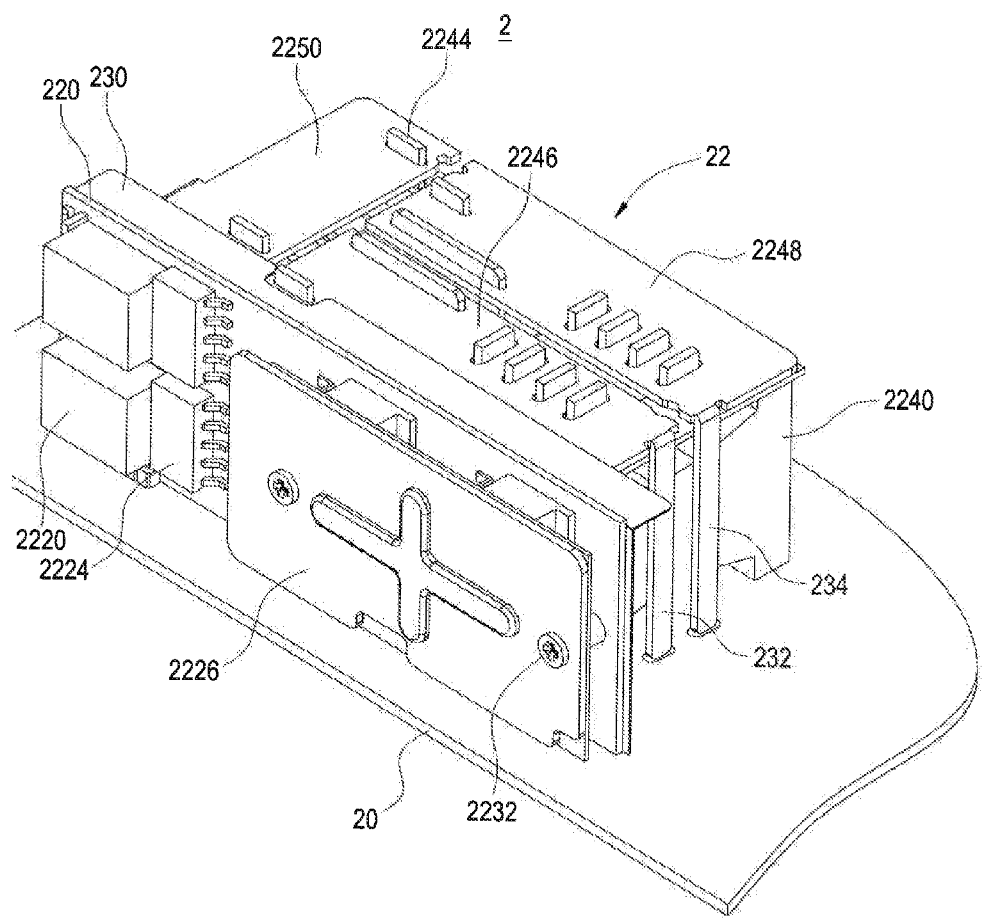
FIG. 4 is another assembly view of the power system according to the first embodiment of the present invention.

Reference is made to FIG. 2 to FIG. 4. FIG. 2 is a partially exploded view of a power system according to a first embodiment of the present invention, FIG. 3 is an assembly view of the power system according to the first embodiment of the present invention, and FIG. 4 is another assembly view of the power system according to the first embodiment of the present invention. The power system 2 includes a main plate 20 and a power converting device 22. The power converting device 22 is mounted on the main board 20 and electrically connected thereto. The power system 2 may include one or more power converting devices 22, and in this embodiment, the power system 2 includes, for example, only one power converting system 22.

A plurality of inserting portions 200, a plurality of inserting holes 206 are disposed on the main plate 20. The main plate 20 is also provided with traces (not shown) for conducting electronic power formed thereon. The inserting portions 200 and the inserting holes 206 are slot structure penetrating through an upper surface and a lower surface of the main plate 20, and a rim of each inserting portion 200 and each inserting holes 206 is covered by a metallic layer 202 electrically connected to the traces. The main plate 20 is printed circuit board (PCB), metal core PCB or ceramic PCB. In particularly, the thermal-dissipating effect of the metal core PCB is better the thermal-dissipating effect the PCB.

Figure 5:
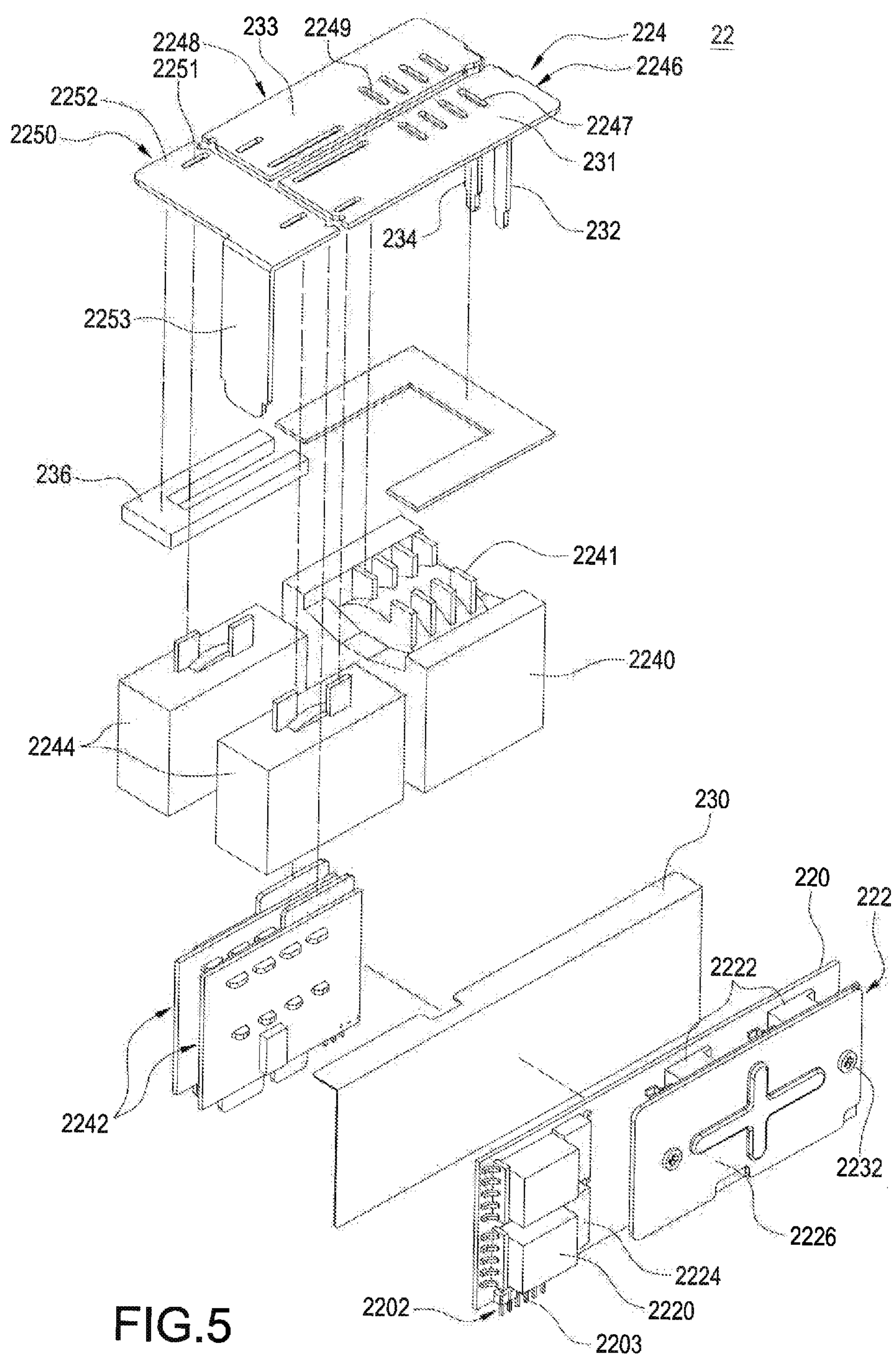
FIG. 5 is an exploded view of a power converting device according to the first embodiment of the present invention.
Figure 6:
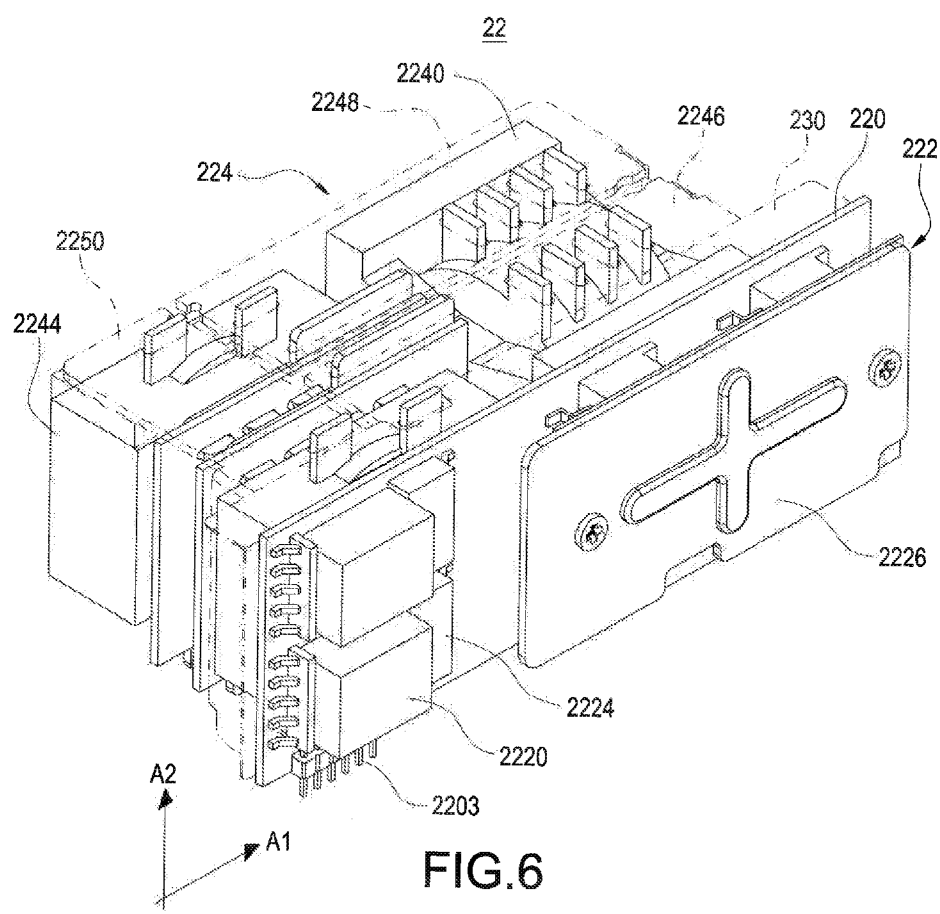
FIG. 6 is a partially assembly view of the power converting device according to the first embodiment of the present invention.
Figure 7:
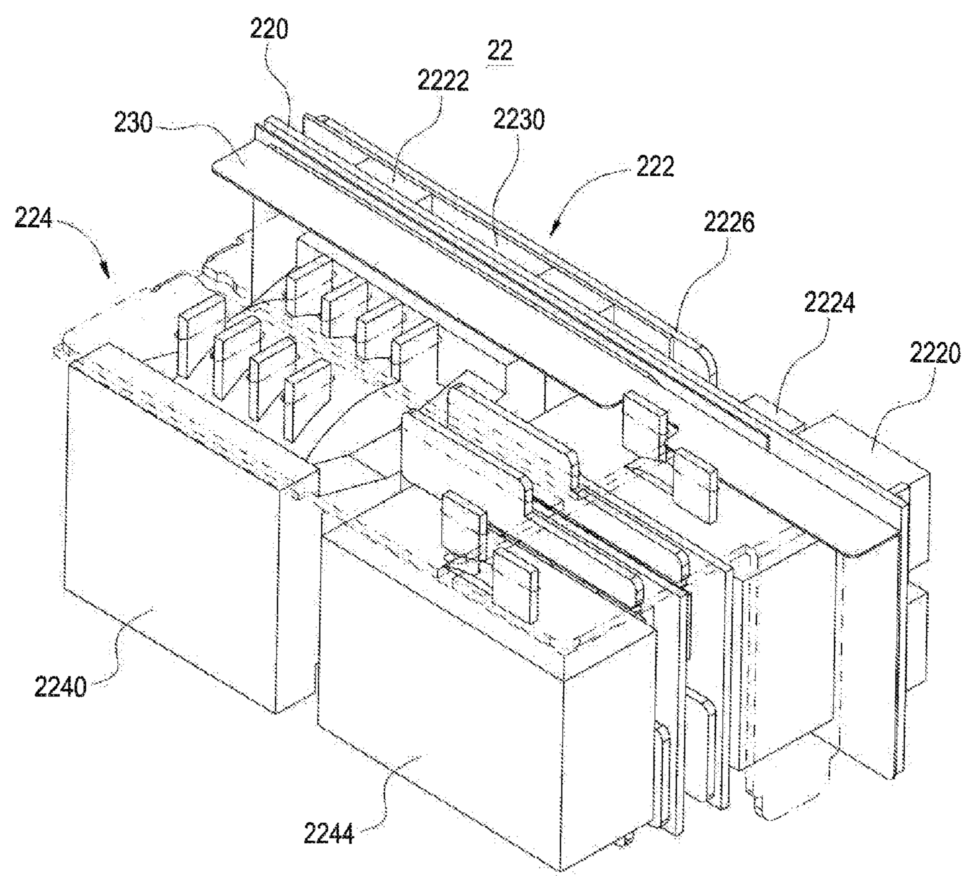
FIG. 7 is another partially assembly view of the power converting device according to the first embodiment of the present invention.

Reference is made to FIG. 5 to FIG. 7. FIG. 5 is an exploded view of a power converting device according to the first embodiment of the present invention, FIG. 6 is a partially assembly view of the power converting device according to the first embodiment of the present invention, and FIG. 7 is another partially assembly view of the power converting device according to the first embodiment of the present invention. The power converting device 22 includes a first substrate 220, a driving module 222, and a converting module 224. The driving module 222 is placed on one side of the first substrate 220 for receiving electronic power inputted to the power converting device 22, and then drives the power converting device 22. The converting module 224 is located at the other side of the first substrate 220 and electrically connected to the driving module 222. The converting module 224 receives the electronic power outputted by the driving module 222 and provides a function of voltage converting for reducing voltage value of the electronic power.

Figure 8:
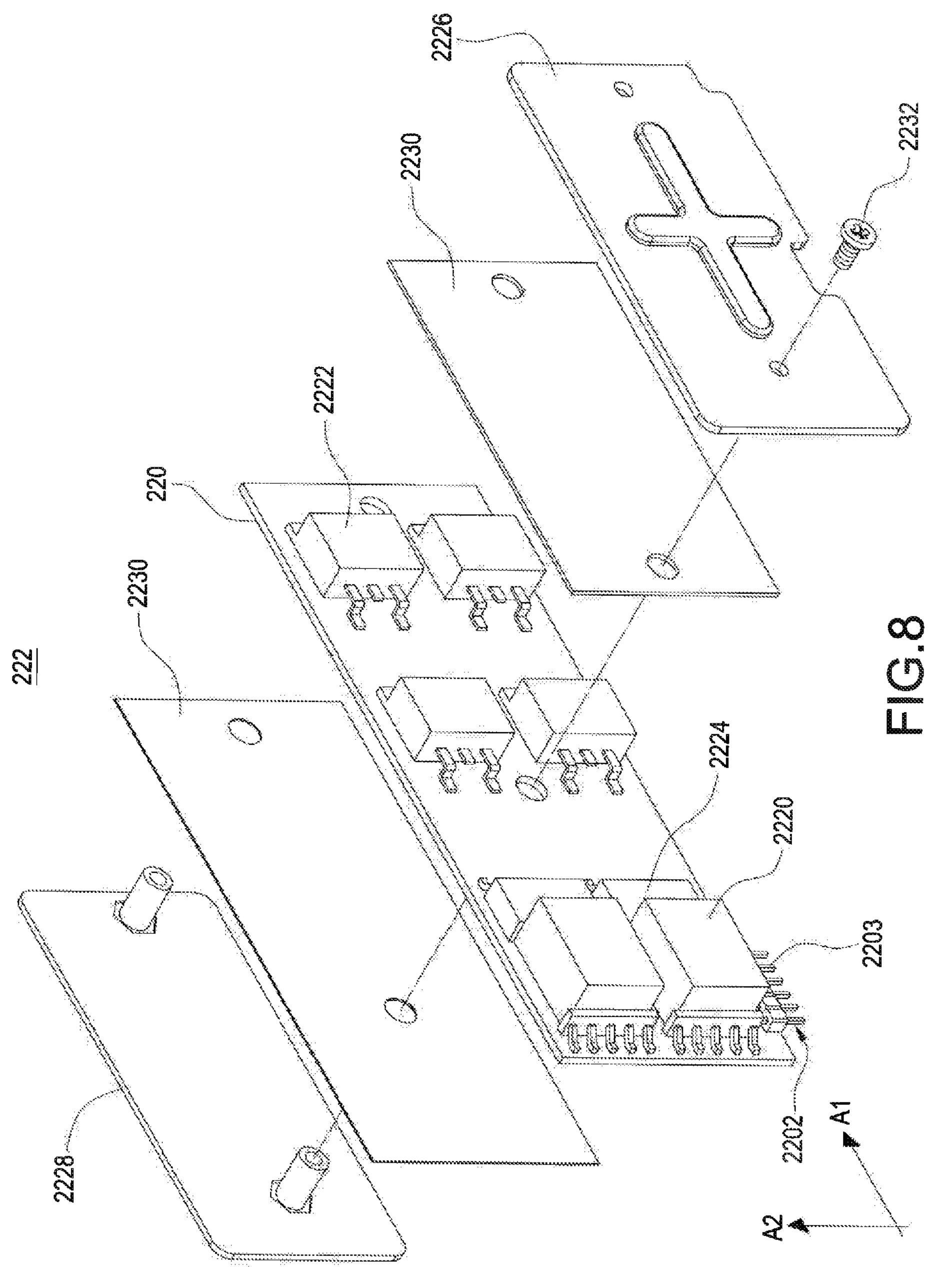
FIG. 8 is an explored view of the first substrate and the converting module according to the first embodiment of the present invention.

Reference is made to FIG. 8, which is an explored view of the first substrate and the converting module according to the first embodiment of the present invention. The first substrate 220 is, for example, a PCB or a substrate (such as copper substrate, aluminum substrate, ceramic substrate) provided with traces. However, the first substrate 220 may also be a substrate combined with PCB and electrically connected plate (such as copper plate). The first substrate 220 has a first axial direction A1 and a second axial direction A2 perpendicular to the first axial direction A1. In this embodiment, the first axial direction A1 is a lengthwise direction of the first substrate 220, and the second axial direction A2 is a widthwise direction of the first substrate 220.

A conductive portion 2202 is disposed at one end of the first substrate 220. In this embodiment, the conductive portion 2202 is composed of a plurality of alignments 2203. The alignments 2203 are respectively inserted into the inserting holes 206 (as shown in FIG. 2), such that the first substrate 220 is fixed on one side of the main plate 20, and the driving module 222 placed on the first substrate 220 is electrically connected to the main plate 20 via the alignments 2203. Each alignment 2203 is bent 90 degrees, and two ends of each alignment 2203 are respectively contacted with the first substrate 220 and the main plate 20. The alignments 2203 and the inserting holes 206 are electrically connected via solder (not shown) disposed therebetween.

The driving module 222 includes a plurality of converters 2220, a plurality of switching components 2222, and a plurality of electronic components 2224. The converters 2220, the switching components 2222, and electronic components 2224 respectively arranged on the first substrate 220 and electrically connected to the first substrate 220 collectively construct a driving circuit. In this embodiment, the driving module 222 includes, for example, two converters 2220 and four switching components 2222, and each switching component 2222 is, but not limited to, metal-oxide-semiconductor field-effect transistor (MOSFET).

The driving module 222 further includes a first thermal-dissipating plate 2226, a second thermal-dissipating plate 2228, two insulating plates 2230, and a plurality of fixing components 2232 for providing electromagnetic isolating effect and thermal-dissipating effect. The first thermal-dissipating plate 2226 is located at one side of the first substrate 220, and the second thermal-dissipating 2228 is located at the other side of the first substrate 220. One of the insulating plates 2230 is located between the first thermal-dissipating plate 2226 and the first substrate 220, and the other insulating plate 2230 is located between the second thermal-dissipating plate 2228 and the first substrate 220. The fixing components 2232 penetrates the first thermal-dissipating plate 2226, the first substrate 220, and the insulating plates, and are fastened on the second thermal-dissipating plate 2228 to fix the first thermal-dissipating plate 2226, the second thermal-dissipating plate 2228, the insulating plates 2230, and the first substrate 220. In this embodiment, an area of a large surface of the first thermal-dissipating plate 2226 is substantially equal to the arranging area of switching components 2222 placed on the first substrate 220, an area of a large surface of the second thermal-dissipating plate is substantially equal to the arranging area of switching components 2222 placed on the first substrate 220, and an area of each insulating plate 2228 is substantially equal to the arranging area of switching components 2222 placed on the first substrate 220.

With referred again to FIG. 6, a length of the converting module 224 is substantially equal to a length of the first substrate 220 in the first axial direction A1, and a width of the converting module 224 is smaller than the length of the first substrate 220 in the first axial direction A1. Such that the volume of the power converting device 22 can be effectively reduced, and a compact power converting device 22 is provided.

With referred again to FIG. 5, the converting module 224 includes a converting component 2240, two rectifying units 2242, and two filtering units 2244, a first electrically conductive plate 2246, a second electrically conductive plate 2248, and a third electrically conductive plate 2250. The rectifying units 2242 and the filtering units 2244 are symmetrically arranged relative to the converting component 2240. In this embodiment, the converting component 2240 is arranged at right side in FIG. 5, the rectifying units 2242 and the filtering units 2242 are arranged at left side in FIG. 5. In particularly, the rectifying units 2242 are arranged at the central position of the left side in FIG. 5, and the filtering units 2244 are respectively disposed at two sides of the rectifying units 2244. A length of the converting component 2240 in the first axial A1 is substantially equal to a length of each filtering unit 2242 or each filtering unit 2244 in the first axial A1, and a length of the converting component 2240 in the second axial A2 is substantially equal to an arranging length of the rectifying units 2242 and the filtering units 2244 in the second axial direction A2.

The first electrically conductive plate 2246, the second electrically conductive plate 2248, and the third electrically conductive plate 2250 are, for example, made of copper plate coating with tin for providing good electrically and thermal conductivity. The first electrically conductive plate 2246, the second electrically conductive plate 2248, and the third electrically conductive plate 2250 are used for current conductive path.

The first electrically conductive plate 2246 include a first body 231 and a first extending section 232 extending from the first body 231 and perpendicular to the first body 231. A plurality of first slot portions 2247 are formed on the first body 231. The second electrically conductive plate 2248 includes a second body 233 and a second extending section 234 extending from the second body 233 and perpendicular to the second body 233. A plurality of second slot portions 2249 are formed on the second body 233. In particularly, the size of the first body 231 is substantially equal to the size of the second body 233. The first extending section 232 and the second extending section 234 are respectively inserted into the inserting portions 200 (as shown in FIG. 2), such that the first electrically conductive plate 2246 and the second electrically conductive plate 2248 are electrically connected to the main plate 20. The third electrically conductive plate 2250 includes a third body 2252 and a third extending section 2253 extending from the third body 2252 and perpendicular to the third body 2252. A plurality of third slot portions 2251 are formed on the third body 2252. The third extending section 2253 is inserted into one of the inserting portions 200 (as shown in FIG. 2), such that the third electrically connective plate 2250 is electrically connected to the main plate 20.

The converting component 2240 is, for example, a transformer. The converting component 2240 includes a plurality of conductive terminals 2241. The conductive terminals 2241 are inserted into the first slot portions 2247 and the second slot portions 2249 (as shown in FIG. 6 and FIG. 7), such that the converting element 2240 is electrically connected to the first electrically conductive plate 2246 and the second electrically conductive plate 2248. In particularly, the first slot portions 2247, the second slot portions 2249, and the conductive terminals 2241 are electrically connected via solder (not shown) disposed therebetween. Such that the converting component 2240 is electrically connected to the first electrically conductive plate 2246 and the second electrically conductive plate 2248.

Figure 9:
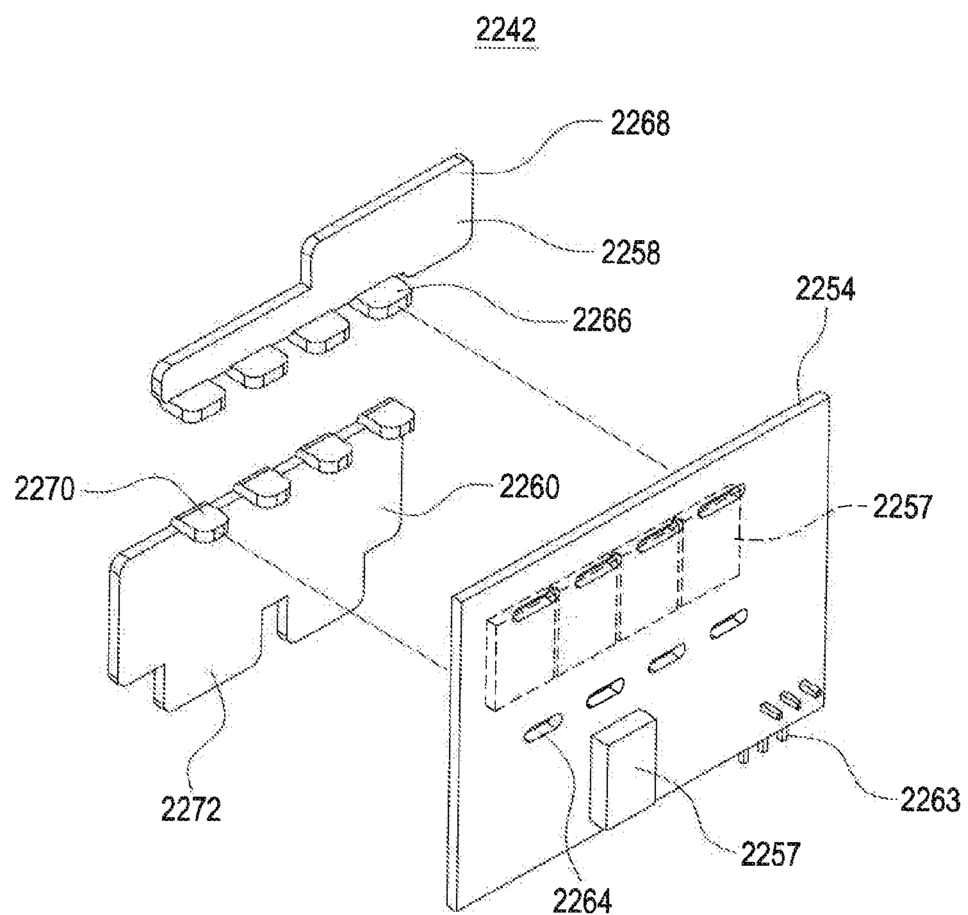
FIG. 9 is an explored view of a rectifying unit according to the first embodiment of the present invention.

Reference is made to FIG. 9, which is an explored view of a rectifying unit according to the first embodiment of the present invention. Each rectifying unit 2242 includes a first circuit board 2254, a first metallic component 2258, a second metallic component 2260, and an alignment assembly 2263. The first circuit board 2254 is, for example, PCB, metal core PCB or ceramic PCB. A plurality of electronic components 2257 including rectifying components (such as diodes or transistors) for composing rectifying circuit are mounted on two planes of the first circuit board 2254.

A plurality of through-hole portions 2264 is disposed on the first circuit board 2254. A rim of each through-hole portion 2264 is covered by a metallic layer (not shown). The first metallic component 2258 and the second metallic component 2260 is, for example, copper plate. The first metallic component 2258 includes a plurality of first bent portions 2266 and a first protrusion 2268. The second metallic component 2260 includes a plurality of second bent portions 2270 and a plurality of second protrusions 2272. The first bent portions 2266 and the second bent portions 2268 are inserting into the through-hole portions 2264, respectively, such that the first metallic component 2258 and the second metallic 2260 are electrically connected to the first circuit board 2254. In particularly, the first metallic component 2258, the second metallic component 2260, and the first circuit board 2254 are electrically connected via solder (not shown) disposed therebetween. The alignment assembly 2263 is disposed on the first circuit board 2254 and inserted into the inserting holes 206 formed on the main plate 20 (as shown in FIG. 2), such that the first circuit board 2254 is electrically connected to the main plate 20.

The second protrusions 2272 of each rectifying unit 2242 are respectively inserted into the inserting portions 200 of the main plate 20, such that each rectifying unit 2242 is electrically connected to the main plate 20. In particularly, the second protrusions 2272 and the inserting portions 200 are electrically connected via soldering (not shown) disposed therebetween. The first protrusions 2268 of one of the rectifying units 2242 are respectively inserted into the first slot portions 2247 of the first metallic plate 2246, such that the rectifying unit 2242 is electrically connected to the first metallic plate 2246 (as shown in FIG. 5 to FIG. 7). The first protrusions 2268 of the other rectifying unit 2242 are respectively inserted into the second slot portions 2249 of the second metallic plate 2248, such that the rectifying unit 2242 is electrically connected to the second metallic plate 2248. In particularly, the rectifying units 2242 and the main board 20 are electrically connected via solder (not shown) disposed therebetween.

With refer again to FIG. 5 to FIG. 7, one of the filtering units 2244 is inserted into one of the first slot portions 2247 of the first metallic plate 2246 and one of the third slot portions 2251 of the third metallic plate 2250, such that the first metallic plate 2246 and the third metallic plate 2250 are electrically connected to one of the filtering units 2244, and then the first metallic plate 2246 is electrically connected to the third metallic plate 2250. The other filtering unit 2244 is inserted into one of the second slot portions 2249 of the second plate 2248 and the other third slot portion 2251 of the third metallic plate 2250, such that the second metallic plate 2248 and the third metallic plate 2250 are electrically connected to the other filtering unit, and then the second metallic plate 2248 is electrically connected to the third metallic plate 2250.

The power converting device 22 further includes a frame 230 and a plurality of connecting components 236. The frame 230 covers the converting module 224. One of the connecting components 236 is disposed between the converting component 2240, the first electrically conductive plate 2246, and the second electrically conductive plate 2248. The other connecting component 236 is disposed between one of the filtering units 2244, the second electrically conductive plate 2248, and the third conductive plate 2250.

To sum up, the power converting device 22 is directly inserted the first substrate 220 into the main plate 20. The driving module 222 and the converting module 224 are respectively located at both side of the first substrate 220, and the rectifying units 2242 and the filtering units 2244 of the converting module 224 are symmetrically arranged relative to the converting component 2240, such that the volume of the power converting device 22 can effectively decreased and the route for transmitting current can be also reduced.

Figure 10:
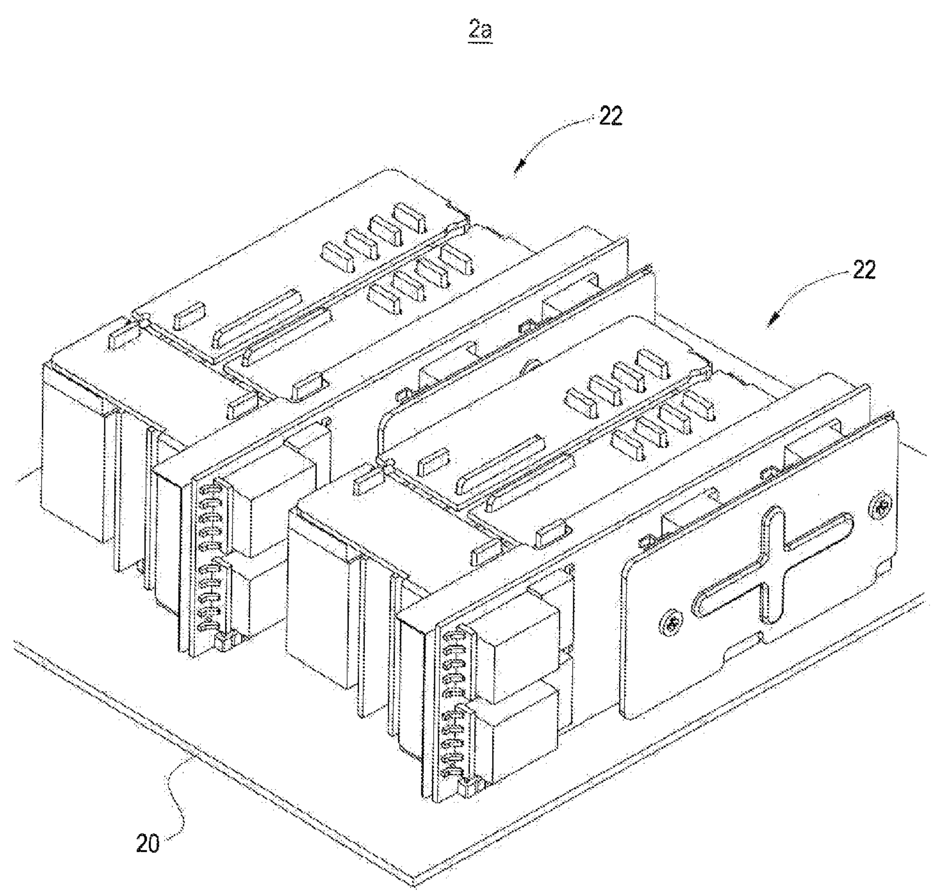
FIG. 10 is an assembly view of a power system according to a second embodiment of the present invention.

Reference is made to FIG. 10, which is an assembly view of a power system according to a second embodiment of the present invention. The power system **2*a* is similar to the power system 2 mentioned above, and the same reference numbers are used in the drawings and the description to refer to the same parts. The difference is that the power system 2*a* shown in FIG. 10 includes a plurality of power converting devices 22. The power converting devices 22 are respectively mounted on the main plate 20 and electrically connected thereto. In this embodiment, the power system 2*a* includes two power converting devices 22. The power converting devices 22 are juxtaposed on the main plate 200** and electrically connected in parallel.

Therefore, when the power system **2*a* is operated with light load, only one power converting device 22 is activated for reducing outputting electric power. When the power system 2*a* is operated with heavy load, a plurality of the power converting devices 22 are activated to increase outputting electric power. For this result, the power system 2*a*** can achieve optimal efficiency wherever operating with light load or heavy load, and prevent the problem of pool efficiency of high power system as operating with light load.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is

1. A power converting device mounted on a main plate, the power converting device comprising:

a first substrate having a first axial direction and a second axial direction perpendicular to the first axial direction, the first substrate inserted into the main plate, such that the second axial direction being perpendicular to the main plate;

a driving module placed at one side of the first substrate and electrically connected to the first substrate; and a converting module located at the other side of the first substrate and electrically connected to the driving module, the converting module comprising a converting component, two rectifying units, and two filtering units, the rectifying units and the filtering units being symmetrically arranged relative to the converting component, wherein a length of the converting module is substantially equal to a length of the first substrate in the first axial direction, and a width of the converting module is smaller than the length of the first substrate in the first axial direction.

2. The power converting device in claim 1, wherein the converting module further comprises a first electrically conductive plate, a second electrically conductive plate, and a third electrically conductive plate disposed opposite to the main plate, the first electrically conductive plate is electrically connected to the converting component, the rectifying units, and the filtering units, the third electrically conductive units is contacted with the filtering units.

3. The power converting device in claim 2, Wherein the first electrically conductive plate comprises a first extending section, the second electrically conductive plate comprises a second extending section, the third electrically conductive plate comprises a third extending section, the first extending section, the second extending section, and the third extending section are respectively inserted into the main plate and electrically connected to the main plate.

4. The power converting device in claim 3, wherein each rectifying unit comprises:

a first circuit board having a plurality of through-hole portions;

a plurality of electronic components respective disposed on the first circuit board;

a first metallic plate comprising a plurality of first bent portions and a first protrusion, the first bent portions inserted into the through-hole portions, and first protrusion connected to one of the first electrically conductive plate and the second electrically conductive plate; and a second metallic plate comprising a plurality of second bent portions and a plurality of second protrusions, the second bent portions inserted into the through-hole portion, and the second protrusions inserted into a plurality of inserting portions formed on the main plate.

5. The power converting device in claim 4, wherein filtering units are inductors.

6. The power converting device in claim 4, wherein the driving module further comprises:

a first thermal-dissipating plate located at one side of the first substrate;

a second thermal-dissipating plate located at the other side of the first substrate; and a plurality of fixing components penetrating the first thermal-dissipating plate and the first substrate, and being fastened on the second thermal-dissipating plate.

7. The power converting device in claim 6, wherein the driving module further comprises two insulating plates, one of the insulating plates is located between the first thermal-dissipating plate and the first substrate, and the other insulating plate is located between the second dissipating plate and the first substrate, the fixing component penetrates the insulating plates.

8. The power converting device in claim 7, wherein the driving unit further comprises at least one converter and a plurality of switching components respectively placed on the first substrate and electrically connected to the first substrate.

9. The power converting device in claim 8, wherein an area of a large surface of the first thermal-dissipating plate, the second dissipating plate, and the insulating plate is substantially equal to the arranging area of switching components placed on the first substrate.

10. The power converting device in claim 1, wherein the first substrate comprises a conductive portion, the conductive portion is inserted into at least one inserting portion formed on the main plate.

11. A power system comprising:

a main plate; and a plurality of power converting devices mounted on the main plate, each power converting device comprising:

a first substrate having a first axial direction and a second axial direction perpendicular to the first axial direction, the first substrate inserted into the main plate, such that the second axial direction being perpendicular to the main plate;

a driving module placed at one side of the first substrate and electrically connected to the first substrate; and a converting module located at the other side of the first substrate and electrically connected to the driving module, the converting module comprising a converting component, two rectifying units, and two filtering units, the rectifying units and the filtering units being symmetrically arranged relative to the converting component, wherein a length of the converting module is substantially equal to a length of the first substrate in the first axial direction, and a width of the converting module is smaller than the length of the first substrate in the first axial direction.

12. The power system in claim 11, wherein the power converting devices are juxtaposed on the main plate.

13. The power system claim 11, wherein the converting module further comprises a first electrically conductive plate, a second electrically conductive plate, and a third electrically conductive plate disposed opposite to the main plate, the first electrically conductive plate is electrically connected to the converting component, the rectifying units, and the filtering units, the third electrically conductive units is electrically connected to the filtering units.

14. The power system in claim 13, wherein the first electrically conductive plate comprises a first extending section, the second electrically conductive plate comprises a second extending section, the third electrically conductive plate comprises a third extending section, the first extending section, the second extending section, and the third extending section are respectively inserted into the main plate and electrically connected to the main plate.

15. The power system in claim 11, wherein each rectifying unit comprises:

a first circuit board having a plurality of through-hole portions;

a plurality of electronic components respective disposed on the first circuit board;

a first metallic plate comprising a plurality of first bent portions and a first protrusion, the first bent portions inserted into the through-hole portions, and first protrusion connected to one of the first electrically conductive plate and the second electrically conductive plate; and a second metallic plate comprising a plurality of second bent portions and a plurality of second protrusions, the second bent portions inserted into the through-hole portion, and the second protrusions inserted into a plurality of inserting portions formed on the main plate.

16. The power system in claim 11, wherein filtering units are inductors.

17. The power system in claim 11, wherein the driving module further comprises:

a first thermal-dissipating plate located at one side of the first substrate;

a second thermal-dissipating plate located at the other side of the first substrate; and a plurality of fixing components penetrating the first thermal-dissipating plate and the first substrate, and being fastened on the second thermal-dissipating plate.

18. The power system in claim 17, wherein the driving module further comprises two insulating plates, one of the insulating plates is located between the first thermal-dissipating plate and the first substrate, and the other insulating plate is located between the second dissipating plate and the first substrate, the fixing component penetrates the insulating plates.

19. The power system in claim 11, wherein the driving unit further comprises at least one converter and a plurality of switching components respectively placed on the first substrate and electrically connected to the first substrate.

20. The power system in claim 18, wherein an area of a large surface of the first thermal-dissipating plate, the second dissipating plate, and the insulating plate is substantially equal to the arranging area of switching components placed on the first substrate.

21. The power system in claim 11, wherein the first substrate comprises a conductive portion, the conductive portion is inserted into at least one inserting portion formed on the main plate.

* * * * *